United States Patent
Lee et al.

(10) Patent No.: US 6,232,214 B1
(45) Date of Patent: *May 15, 2001

(54) METHOD FOR FABRICATING INTER-METAL DIELECTRIC LAYER

(75) Inventors: Claymens Lee, Fengshan; Gary Hong, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/316,475

(22) Filed: May 21, 1999

(30) Foreign Application Priority Data

Apr. 19, 1999 (TW) .................................................. 88106212

(51) Int. Cl.$^7$ .............................................. H01L 21/4763
(52) U.S. Cl. .......................... 438/619; 438/669; 438/739; 438/221; 438/282; 438/422; 438/778
(58) Field of Search ................................. 438/619, 622, 438/669, 739, 221, 230, 282, 422, 778, 624, 696, 699

(56) References Cited

U.S. PATENT DOCUMENTS

| | | | |
|---|---|---|---|
| 5,516,720 | * | 5/1996 | Lur et al. ............................... 437/67 |
| 5,814,555 | * | 9/1998 | Bandyopadhyay et al. .......... 438/619 |
| 5,837,618 | * | 11/1998 | Avanzino et al. ..................... 438/778 |
| 5,872,064 | * | 2/1999 | Huff et al. ............................. 438/778 |
| 5,882,968 | * | 3/1999 | Jun ........................................ 438/254 |
| 5,918,152 | * | 6/1999 | Erzhuang et al. ..................... 438/782 |
| 5,953,625 | * | 9/1999 | Bang ...................................... 438/619 |
| 6,035,530 | * | 3/2000 | Hong ...................................... 29/885 |

\* cited by examiner

*Primary Examiner*—Matthew Smith
*Assistant Examiner*—Renzo N. Rocchegiani
(74) *Attorney, Agent, or Firm*—Jiawei Huang; J.C. Patents

(57) ABSTRACT

A method for fabricating an inter-metal dielectric layer. Several conducting wires are formed on a substrate, and openings lie between the adjacent conducting wires. A first dielectric layer fills the openings, and the surface of the first dielectric layer is lower than that of the conducting wires. A spacer is formed on a sidewall of each of the conducting wires. The first dielectric layer is removed to expose the bottom of the spacer. A second dielectric layer is formed to cover the conducting wires.

14 Claims, 2 Drawing Sheets

METHOD FOR FABRICATING INTER-METAL DIELECTRIC LAYER

CROSS-REFERENCE TO RELATED APPLICATION

This application claims the priority benefit of Taiwan application serial no. 88106212, filed Apr. 19, 1999, the full disclosure of which is incorporated herein by reference.

BACKGROUND OF THE INVENTION

1. Field of the Invention

The present invention relates to a method for fabricating an inter-metal dielectric layer. More particularly, the present invention relates to a method for fabricating an inter-metal dielectric layer, which reduces RC delay.

2. Description of the Related Art

Because the linewidth of devices is continuously shrinking, the parasitic capacitor effect between metal wires is increasingly serious and RC delay increases. The parasitic capacitor effect easily occurs because the dielectric constant of a dielectric material, which forms an inter-metal dielectric layer, is large. Dielectric material with a low dielectric constant is therefore chosen to overcome the above problem.

In conventional technology, however, the parasitic capacitor effect between metal wires is not always effectively decreased because the dielectric constant of the dielectric material is not low enough.

SUMMARY OF THE INVENTION

Accordingly, the present invention provides a method for fabricating an inter-metal dielectric layer, which reduces RC delay.

To achieve these and other advantages and in accordance with the purpose of the invention, as embodied and broadly described herein, the invention provides a method for fabricating an inter-metal dielectric layer. The method includes the following steps. Several conducting wires are formed on a substrate, with openings between the adjacent conducting wires. A first dielectric layer fills the openings, and the surface of the first dielectric layer is lower than that of the conducting wires. A spacer is formed on a sidewall of each of the conducting wires. The first dielectric layer is removed to expose the bottom of the spacer. A second dielectric layer is formed to cover the conducting wires.

Because the spacer is formed on the sidewall of each of the conducting wires, the opening is narrower. A void is formed in the second dielectric layer. Since the dielectric constant of air is about 1, dielectric constant of a region between the narrower conducting wires is reduced. As a result, RC delay is reduced, and performance of the device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
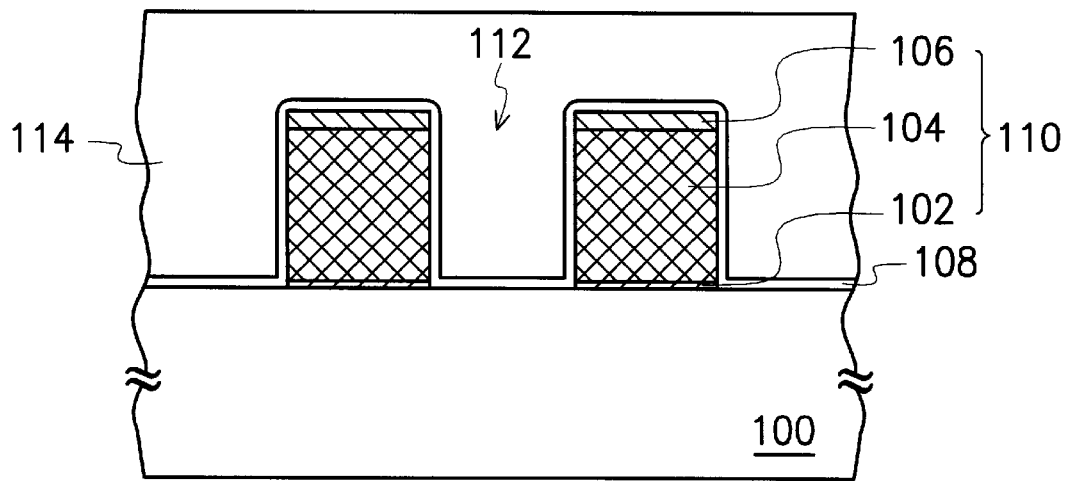
FIGS. 1 through 3 are schematic, cross-sectional diagrams used to depict steps in a method according to the invention for fabricating an inter-metal dielectric layer.

Reference will now be made in detail to the present preferred embodiments of the invention, examples of which are illustrated in the accompanying drawings. Wherever possible, the same reference numbers are used in the drawings and the description to refer to the same or like parts.

Figure 2:
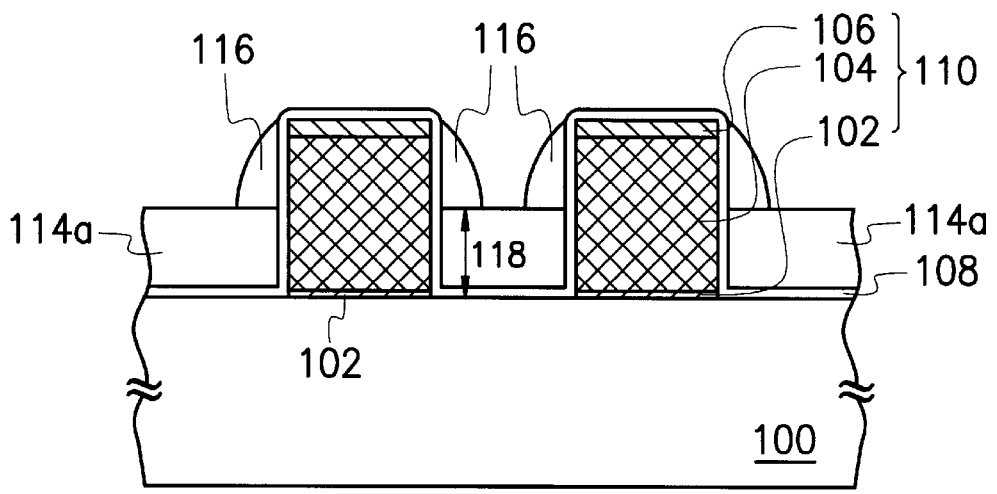
Figure 3:
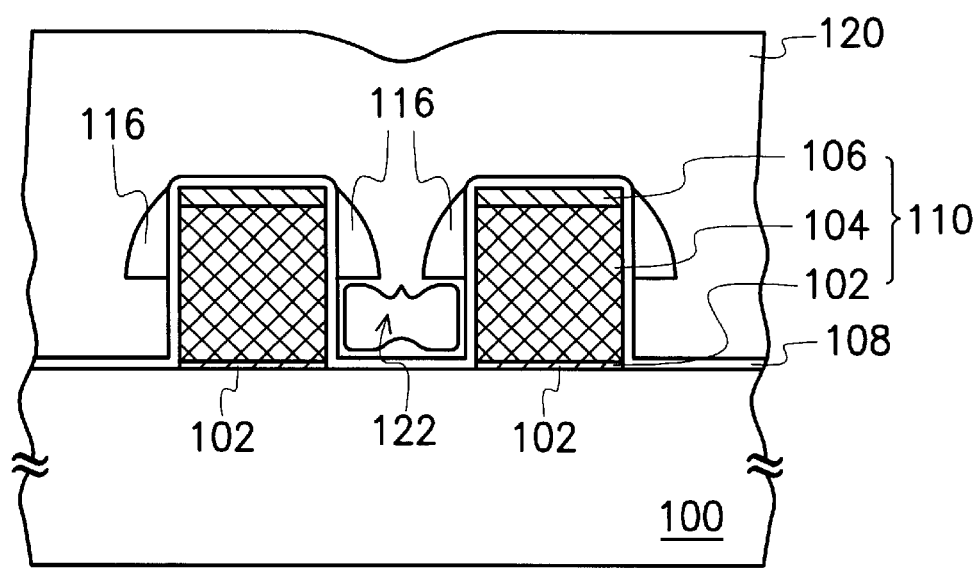

FIGS. 1 through 3 are schematic, cross-sectional diagrams used to depict steps in a method according to the invention for fabricating an inter-metal dielectric layer.

Referring to FIG. 1, a substrate 100 having at least a MOS thereon (not shown) is provided. Conducting wires 110 are formed on the substrate 100. Etch of the conducting wires 110 comprises a barrier layer 102, a metal layer 104 and an anti-reflective layer 106. The thickness of each of the conducting wires 110 is about 5000 to 6000 Å. The barrier layer 102 includes titanium nitride or titanium/titanium nitride. The metal layer 104 includes aluminum or aluminum alloy. The anti-reflective layer 106 is, for example, titanium nitride. An opening 112 lies between the adjacent conducting wires 110, and the opening, 112 in FIG. 1 is narrow.

A conformal dielectric layer 108 is formed over the substrate 100. The conformal dielectric layer 108 is, for example, silicon dioxide. The conformal dielectric layer 108 which covers the conducting wires 110 improves adhesion and isolation between the conducting wires 110 and the subsequently formed dielectric layer. A dielectric layer 114 is formed on the conformal dielectric layer 108 and fills the opening 112. The material used to form the dielectric layer 114 is different from that of the conformal dielectric layer 108. For example, the material is silicon nitride. The dielectric layer 114 is planarized by, for example, chemical-mechanical polishing.

Referring to FIG. 2, a portion of the dielectric layer 114 is removed to form a dielectric layer 114a by, for example, etching back. Therefore, the surface of the dielectric layer 114a is lower than that of the conducting wires 110. Additionally, the thickness of the dielectric layer 114a is about 3000 to 4000 Å. A spacer 116 is formed on a sidewall of each of the conducting wires 100. The material used to form the spacer 116 is different from that of the dielectric layer 114a. For example, the material is silicon dioxide.

Referring to FIG. 3, an isotropic etching process is performed to remove the dielectric layer 114a by using, for example, hot phosphoric acid as an etchant, so that the bottom surface of the spacer 116 is exposed. The distance between the bottom surface of the spacer 116 and the bottom of the opening 112 is approximately equal to the thickness of the dielectric layer 114a (FIG. 2). A dielectric layer 120 is formed over the substrate 100 by, for example, plasma enhanced chemical vapor deposition. Since the opening 112 is narrow, the step coverage of the dielectric layer 120 is poor. As a result, a void 122 is formed within the opening 112.

Since dielectric constant of air is about 1, the equivalent dielectric layer of a region between the conducting wires 110 is reduced. RC delay is reduced due to the void 122 within the opening 112.

According to the foregoing, the advantages of the invention include the following:

1. Because the spacer is formed on the sidewall of each of the conducting wires, the opening is narrower. The step coverage of the subsequently formed inter-metal dielectric layer is poor. A void is formed in the inter-metal dielectric layer.

2. Because dielectric constant of air is about 1, the dielectric constant of the region between the narrower conducting wires is reduced. As a result, RC delay is reduced, and performance of the device is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an inter-metal dielectric layer, comprising the steps of:

providing a substrate;

forming a plurality of conducting wires on the substrate, wherein a plurality of openings lies between the conducting wires;

forming a first dielectric layer in the openings, wherein the surface of the first dielectric layer is lower than that of the conducting wires;

forming a spacer on a sidewall of each of the conducting wires;

removing the first dielectric layer; and forming a second dielectric layer on the conducting wires.

2. The method of claim 1, wherein the conducting wires includes aluminum.

3. The method of claim 1, wherein a conformal dielectric layer is formed over the substrate before forming the first dielectric layer.

4. The method of claim 1, wherein the first dielectric layer includes silicon nitride, and the spacer includes silicon dioxide.

5. The method of claim 1, wherein the step of removing the first dielectric layer includes isotropic etching which uses hot phosphoric acid as an etchant.

6. The method of claim 1, wherein the step of forming the first dielectric layer comprises the steps of forming the first dielectric layer, which is planarized, in the openings; and performing an etch back process to remove a portion of the first dielectric layer.

7. A method for fabricating an inter-metal dielectric layer, comprising the steps of:

providing a substrate;

forming at least two adjacent conducting wires on the substrate, wherein an opening lies between the conducting wires;

forming a spacer on a sidewall of each of the conducting wires; and forming a first dielectric layer to cover the conducting wires, wherein a void is formed within the opening.

8. The method of claim 7, wherein a conformal dielectric layer is formed over the substrate before forming the first dielectric layer.

9. The method of claim 7, wherein the method of forming the spacer comprises the steps of forming a second dielectric layer, which is planarized, in the opening;

performing an etch back process to remove a portion of the second dielectric layer, wherein the surface of the residual second dielectric layer is lower than that of the conducting wires;

forming the spacer on a sidewall of each of the conducting wires; and removing the residual second dielectric layer.

10. The method of claim 9, wherein the second dielectric layer includes silicon nitride and the spacer includes silicon dioxide.

11. The method of claim 10, wherein the step of removing the residual second dielectric layer includes isotropic etching which uses hot phosphoric acid as an etchant.

12. A method for fabricating an inter-metal dielectric layer, comprising the steps of:

proving a substrate;

forming at least two adjacent conducting wires on the substrate, wherein an opening lies between the conducting wires;

forming a first dielectric layer, which planarized, in the opening;

performing an etch back process to remove a portion of the first dielectric layer wherein the surface of the residual first dielectric layer is lower that of the conducting wires;

forming a spacer on a sidewall of each of the conducting wires;

removing the residual first dielectric layer forming a second dielectric layer to cover the conducting wires, wherein a void is formed within the opening.

13. The method of claim 12, wherein the first dielectric layer includes silicon nitride and the spacer includes silicon dioxide.

14. The method of claim 12, wherein the step of removing the residual first dielectric layer includes isotropic etching which uses hot phosphoric acid as an etchant.

* * * * *